(12) United States Patent
Penney et al.

(10) Patent No.: US 11,264,078 B2
(45) Date of Patent: Mar. 1, 2022

(54) METASTABLE RESISTANT LATCH

(71) Applicant: Micron Technology, inc., Boise, ID (US)

(72) Inventors: Daniel B. Penney, Wylie, TX (US); William C. Waldrop, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 239 days.

(21) Appl. No.: 16/781,763

(22) Filed: Feb. 4, 2020

(65) Prior Publication Data

US 2021/0241813 A1 Aug. 5, 2021

(51) Int. Cl.
*G11C 11/40* (2006.01)
*G11C 11/4076* (2006.01)
*H03K 19/20* (2006.01)
*H03K 3/037* (2006.01)

(52) U.S. Cl.
CPC .......... *G11C 11/4076* (2013.01); *H03K 3/037* (2013.01); *H03K 19/20* (2013.01)

(58) Field of Classification Search
None
See application file for complete search history.

(56) References Cited

U.S. PATENT DOCUMENTS

| | | | | |
|---|---|---|---|---|
| 4,506,167 A | * | 3/1985 | Little | H03K 3/037 327/202 |
| 8,514,000 B1 | * | 8/2013 | Hsieh | H03K 3/0375 327/218 |
| 2011/0205812 A1 | * | 8/2011 | Kajigaya | G11C 11/4091 365/189.05 |

* cited by examiner

*Primary Examiner* — Tan T. Nguyen
(74) *Attorney, Agent, or Firm* — Fletcher Yoder, P.C.

(57) ABSTRACT

Memory devices receive a data signal and an accompanying data strobing signal, which informs the device that data is ready for latching. The data strobing signal enables capturing the data while the data signal transitions from a logic high to a logic low or vice versa, resulting in an indeterminate output (e.g., between 0 and 1). The indeterminate value may cause metastability in memory operations using the indeterminate output. To prevent or reduce metastability, a cascaded timing arbiter latch includes cascaded alternating NAND timing arbiters and NOR timing arbiters. In some embodiments, these logic gates are connected to transistors above and below the cascaded timing arbiters. The cascaded timing arbiters and/or transistors provide amplification on a feedback path of the latch. In other embodiments, the cascaded timing arbiters are isolated by inverters and are not connected to transistors. This embodiment reduces capacitive loading on nodes of the internal feedback path.

20 Claims, 6 Drawing Sheets

METASTABLE RESISTANT LATCH

BACKGROUND

1. Field of the Invention

The present disclosure relates to memory devices, and more specifically, to methods that mitigate metastability effects in clock signals during data access in the memory devices.

2. Description of the Related Art

Random access memory (RAM) devices, such as the ones used in electronic devices to facilitate data processing and to provide storage, may provide direct access to addressable data storage cells that form the memory circuitry of the device. Certain RAM devices, such as dynamic RAM (DRAM) devices may, for example, have multiple memory banks having many addressable memory elements. The RAM devices may also have a command interface that may receive addresses and instructions (e.g., read, write, etc.) for operations that may be associated with those addresses. The RAM devices may also include decoding circuitry that may translate the instructions and the addresses into internal commands for accessing the corresponding memory banks.

The data exchanged between the processing circuitry (e.g., host) of an electronic device and the memory device may be accompanied by synchronizing clock signals. As an example, during a write process, the electronic device may provide writing commands and addresses that may be synchronized with a clock signal, as well as the data to be stored that may be synchronized with a data strobe signal. That is, the RAM device may coordinate both the writing commands synchronized to a clock signal and the data synchronized to the data strobe signal to perform the write operations.

The data strobe clock signals may enable data capture circuitry, such as a latch and/or circuitry including a latch, during a write data period to capture data from the data signals to output for use by other memory elements or circuitry. In some instances, the data signals and the data strobe clock signal may be enabled simultaneously or approximately simultaneously. As such, the data signal may be transitioning between a logic 1 and 0 to provide the data bits when the data strobe clock signal transitions to a logic 1 to enable capturing the data to provide to the other memory elements or circuitry. Since the data signal may be transitioning, the latched or captured value may be between a 0 and the 1, which is an indeterminate value (e.g., a value between 0 and 1). The indeterminate value to output may cause metastability or uncertainty in logic circuitry that processes the output in the RAM device. The metastability may cause errors for other write data operations, such as a write leveling operation.

BRIEF DESCRIPTION OF THE DRAWINGS

Various aspects of this disclosure may better be understood upon reading the following detailed description and upon reference to the drawings in which.

DETAILED DESCRIPTION OF SPECIFIC EMBODIMENTS

Figure 1:
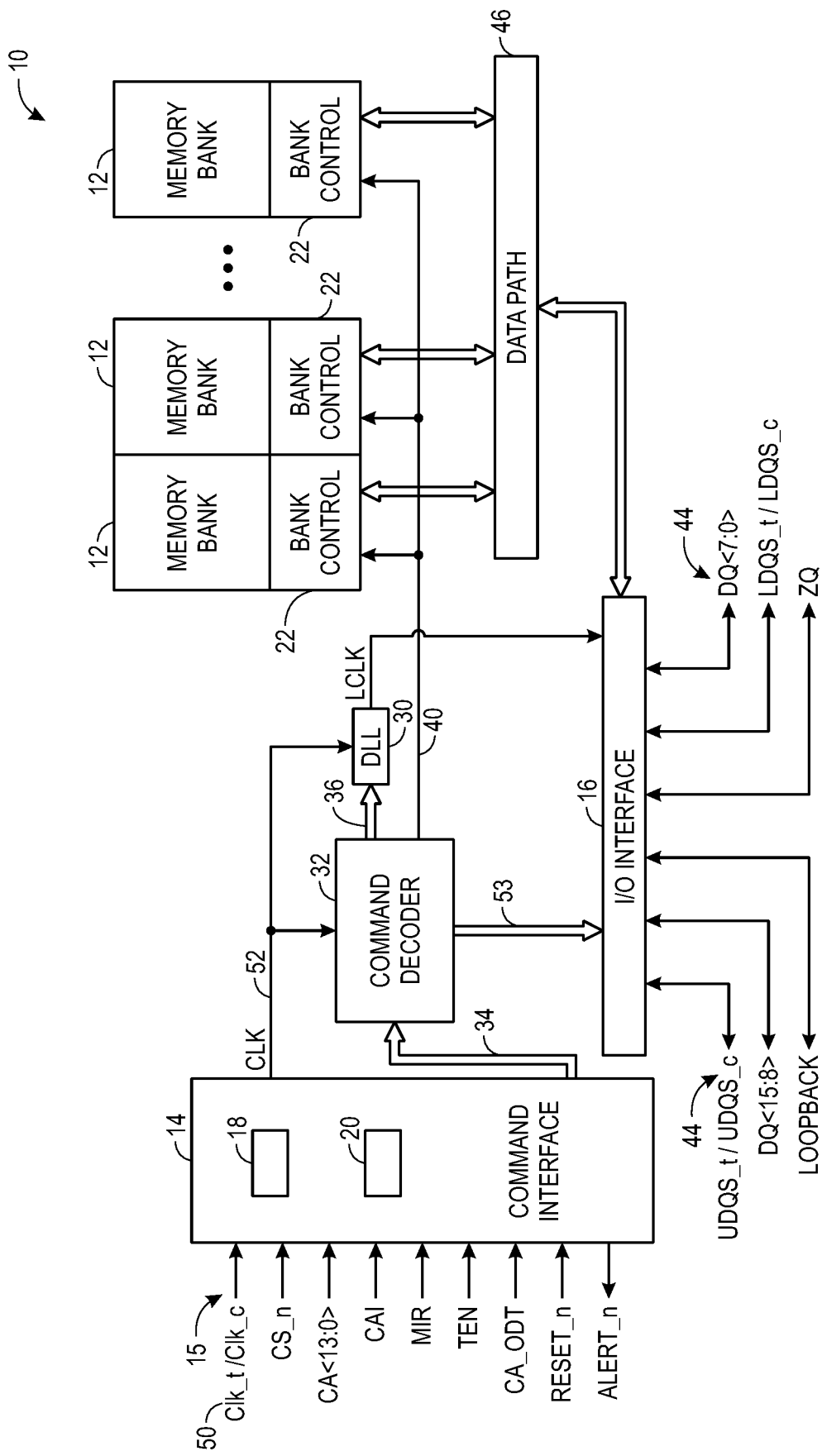
FIG. 1 is a block diagram illustrating an organization of a memory device that may benefit from a metastable resistant latch to mitigate metastability, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electronic systems may use random access memory (RAM) devices that are coupled to processing circuitry (e.g., host) and may provide storage of data for processing. Examples of RAM devices include dynamic RAM (DRAM) devices and synchronous DRAM (SDRAM) devices, which may store individual bits electronically. The stored bits may be organized into addressable memory elements (e.g., words), which may be directly accessed by the processing circuitry. Memory devices may also include command circuitry to receive instructions and/or addresses from the processing circuitry. For example, in double data rate type five (DDR5) SDRAM devices, these instructions and/or addresses may be provided by the processing circuitry by a 14-bit command/address (CA) signal. Moreover, the processing circuitry may also provide clocking signals to the memory device along with the instructions and/or addresses. For example, the CA signal may be synchronized to a clock signal (Clk). In many memory devices, such as in the DDR5 SDRAM devices, processing circuitry may provide the clocking signal (Clk) through a differential clock signal pair (Clk_t and Clk_c) to provide information to the DDR5 SDRAM device indicating when an instruction and/or an address signal is ready to be processed.

In certain situations, such as during a write operation, the processing circuitry may also provide data using a data bus (DQ), which may be synchronized with a data strobe signal (DQS) (e.g., strobe clock signal) that facilitates capture of data in the data bus (DQ) by the memory device. The data strobe signal (DQS) may provide information to the memory device as to when that data (e.g., bits) is available. By way of example, the processing circuitry may provide a clocking signal and instructions to a DDR5 SDRAM device to indicate that a command/address signal (CA) may be available (e.g., stable, ready) for processing during a transition (e.g., edge) of the clocking signal (Clk). If the available command/address signal (CA) is a write command, the processing circuitry may, after a pre-determined time, provide data in a data bus (DQ) along with the data strobe signal (DQS) to indicate that the data in the data bus (DQ) is ready to be stored.

In some instances, the data strobe signal (DQS) may be received by the DDR5 SDRAM device at the same time or approximately the same time as the data bus (DQ) signal. Thus, the data bus (DQ) signal may have insufficient time to transition to its intended state of a logic 0 or 1, resulting in a setup time violation. Thus, the data bus (DQ) signal may include an indeterminate value (e.g., inconsistent, unknown, unexpected), such as a value between 0 and 1. As such, input circuitry that processes the data bus (DQ) signal and the data strobe signal (DQS) may enter an unknown logic state. For example, latches, flip-flops, and/or registers in a data path capturing the data bus (DQ) value or data bits may be in a metastable (e.g., inconsistent, unknown, undesired) state and as a result, provide inaccurate or erroneous data.

Thus, circuitry using these outputs from the metastable latches, flip-flops, and/or registers, such as for a write leveling (WL) operation, may result in errors. In such operations, the metastability may cause errors for a time period (e.g., 10 picoseconds (ps)) when aligning the data strobe signal (DQS) to the clocking signal (Clk) during the write leveling operation. Moreover, these metastable outputs may degrade timing parameter performances. For example, a clock to data strobe signal ($t_{DQSS}$) is a timing parameter that should not be violated when writing to a DRAM memory device. The $t_{DQSS}$ may refer to the position of the data strobe signal (DQS) relative to the clocking signal (Clk). Generally, the $t_{DQSS}$ is set to be within a minimum ($t_{DQSS}$(MIN)) and a maximum ($t_{DQSS}$(MAX)) as defined in the DRAM specification. If the $t_{DQSS}$ is violated and falls outside a range (e.g., between $t_{DQSS}$(MIN) and $t_{DQSS}$(MAX)), then incorrect or incompatible data may be written to the memory. That is, this data may not be correctly processed by circuitry performing the write leveling (WL) operation.

As previously mentioned, multiple signals that may be enabled simultaneously or approximately simultaneously may result in metastability. This metastable race condition may cause errors, for example, in write path enable operations. In particular, the write path should be disabled when there is sufficient time between write operations to do so. If the time duration is insufficient (e.g., a first write operation has not completed), then a disable signal used to reset various control circuits between write operations may cause system glitches and failures. Therefore, contents of a Column Access Strobe (CAS) Write Latency (CWL) shifter may be examined to discover the time difference between consecutive writes and enable the disable signal if that difference, measured as a number of shift stages, is sufficient. However, the CWL shifter may be used as part of a walk back scheme, such that the time difference between the write stages is actually less than a timing clock period (tCK). Because of this, the phase relationship between signals (e.g., data strobe clock signal (DQS) and the clocking signal (Clk)) may be unknown, causing a domain crossing problem. Domain crossing may refer to a traversal of a signal in a synchronous digital circuit from one clock domain (e.g., data strobe signal (DQS)) from external processing circuitry into another (e.g., internal clocking signal (Clk)). If a signal does not assert long enough and is not registered, it may appear asynchronous on the incoming clock boundary. In some instances, the receiving domain may not include multiple clocks to resolve the phase relationship. Moreover, the disable signal should be sent from the last bit of the write data burst. Thus, the phase relationship should be resolved in a "single shot." These metastable outputs and signal race conditions may be resolved using the techniques described herein.

In general, a metastable condition may be addressed in multiple ways. First, maximizing amplification of an internal feedback path for the memory components (e.g., a latch) may resolve metastable conditions. Second, additionally or alternatively to maximizing amplification of the internal feedback path, capacitive loads on the internal feedback path may be minimized to resolve metastable conditions. Third, additionally or alternatively, increasing an amount of time from the asynchronously racing inputs (e.g., the data bus (DQ) signal and the data strobe signal (DQS)) until that the output value may be a definitive value (e.g., a binary 1 or 0) may resolve metastable conditions.

Embodiments described herein relate to methods and systems that may mitigate metastability in memory components (e.g., latches and/or flip-flops) of the input circuitry by cascading stages of timing arbiters. In some embodiments, logic gates of the cascaded timing arbiters may be connected to transistors above and below the cascaded timing arbiters. Both of these embodiments may provide multiple stages of amplification (e.g., maximizing amplification of an internal feedback path) without requiring clocking at each stage. In other embodiments, feedback nodes in the cascaded timing arbiters may be isolated by inverters and may not include transistors. These embodiments may reduce capacitive loading on the internal feedback nodes. It should be noted that, while the embodiments described are related to memory circuitry, the methods and systems may be employed more generally in input circuitry where metastability may affect the performance.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth, and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. By way of example, a 16 Gb DDR5 SDRAM, the memory chip may include 32 memory banks 12, arranged into 8 bank groups, each bank group including 4 memory banks. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a various number of signals (e.g., signals 15) from an external device or host (not shown), such as a processor or controller. The processor or controller may provide the various signals 15 to the memory device 10 to facilitate the transmission and reception of data to be written to and/or read from the memory device 10. In some embodiments, the command interface 14 may include a number of circuits, such as a clock input circuit 18 and a command address input circuit 20, to ensure proper handling of the signals 15. The command interface 14 may receive one or more clock signals from the external device. Generally, the double data rate (DDR) memory utilizes a differential pair of system clock signals, referred to herein as the true clock signal (Clk_t/) and the complementary clock signal (Clk_c) 50. The positive clock edge for DDR refers to the point where the rising true clock signal Clk_t/ crosses the falling complementary clock signal Clk_c, while the negative clock edge indicates the falling true clock signal Clk_t and the rising of the complementary clock signal Clk_c. Commands (e.g., read command, write command, etc.) are often entered on the positive edges of a clock signal, and data is transmitted or received on both the positive and negative clock edges.

The clock input circuit 18 may receive the differential pair of clock signals 50 to generate an internal clock signal (CLK) 52. The internal clock signal (CLK) 52 is supplied to an internal clock generator 30, such as a delay locked loop (DLL) circuit. The internal clock generator 30 generates a phase controlled internal clock signal (LCLK) based on the received internal clock signal (CLK) 52. The phase controlled internal clock signal (LCLK) is supplied to the I/O interface 16, for instance, and is used as a timing signal for determining an output timing of read data or capture window for write data.

The internal clock signal (CLK) 52 may also be provided to various other components within the memory device 10 and may be used to generate various additional internal clock signals. For instance, the internal clock signal (CLK) 52 may be provided to a command decoder 32. The command decoder 32 may receive command signals from a command bus 34 and may decode the command signals to provide various internal commands. For instance, the command decoder 32 may provide command signals to the internal clock generator 30 over a bus 36 to coordinate generation of the phase controlled internal clock signal (LCLK). The phase controlled internal clock signal (LCLK) may be used to clock data through the I/O interface 16.

Furthermore, the command decoder 32 may decode commands, such as read commands, write commands, mode-register set commands, and/or activate commands, and provide instructions to the I/O interface 16 via I/O bus 53 to regulate the flow of data between the data path 46 and the circuitry external to the memory device 10 based on the decoded commands, for example. For example, when a command/address (CA) signal includes a write command or operation, the command decoder 32 may provide a write command to the I/O interface 16 over bus 53 that indicates that the I/O interface 16 may receive data to be stored. Further, the command decoder 32 may, based on the decoded commands, provide access to a particular memory bank 12 corresponding to the command and/or address, via the bus path 40. Moreover, the memory device 10 may include various other decoders, such as row decoders and column decoders, to facilitate access to the memory banks 12. In one embodiment, each memory bank 12 includes a bank control block 22, which provides the necessary decoding (e.g., row decoder and column decoder), as well as other features, such as timing control and data control, to facilitate the execution of commands to and from the memory banks 12.

The memory device 10 may execute operations, such as read commands and write commands, based on the command/address signals received from an external device, such as a processor. As previously discussed, the command/address bus may be a 14-bit bus to accommodate the command/address signals (CA<13:0>). The command/address signals are clocked to the command interface 14 using the differential pair of clock signals 50, as discussed above. The command interface 14 may include a command address input circuit 20, which is configured to receive and transmit the commands to provide access to the memory banks 12 through the command decoder 32. In addition, the command interface 14 may receive a chip select signal (CS_n). The chip select signal (CS_n) enables the memory device 10 to process commands on the incoming CA<13:0> bus. Access to specific memory banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The mirror (MIR) signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the test enable (TEN) signal may be used to place the memory device 10 into a test mode for connectivity testing. The command interface 14 may also be used to provide an alert signal (ALERT_n) to the system processor or controller for certain errors that may be detected. For instance, the alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the test enable (TEN) signal, as described above.

Data may be sent between the memory device 10 and the external device, utilizing the command and clocking signals discussed above, by transmitting and receiving data signals 44 through the I/O interface 16. More specifically, the data may be sent to or retrieved from the memory banks 12 over the data path 46, which includes multiple bi-directional data buses. Data I/O (DQ) signals are generally transmitted and received in one or more bi-directional data buses. For certain memory devices, such as a DDR5 SDRAM memory device, the I/O signals may be divided into upper and lower bytes.

For instance, for an ×16 memory device, the I/O signals may be divided into upper and lower I/O signals (e.g., DQ<15:8>, or upper data signals (UDQ) and DQ<7:0>, or lower data signals (LDQ)) corresponding to upper and lower bytes of the data signals, for instance. In the present disclosure, external data output signals (XDQ) may be used generally to refer to the upper data signals (UDQ) or the lower data signals (LDQ).

To allow for higher data rates within the memory device 10, certain memory devices, such as DDR memory devices, may utilize data strobe (DQS) signals. The data strobe (DQS) signals are driven by the external processor or controller sending the data (e.g., for a write command) or by the memory device 10 (e.g., for a read command), as discussed above. For read commands, the data strobe (DQS) signals are effectively additional data (DQ) signals with a predetermined pattern. For write commands, the data strobe (DQS) signals are used as clock signals 50 to capture the corresponding input data. As with the clock signals (Clk_t/ and Clk_c) 50, the data strobe (DQS) signals may be provided as a differential pair of data strobe signals (DQS_t/ and DQS_c) to provide differential pair signaling during reads and writes. For certain memory devices, such as a DDR5 SDRAM memory device, the differential pairs of data strobe (DQS) signals may be divided into upper data strobe signals (UDQS) and lower data strobe signals (LDQS) (e.g., UDQS_t/ and UDQS_c; LDQS_t/ and LDQS_c) corresponding to upper and lower bytes of data sent to and from the memory device 10, for instance. In the present disclosure, XDQS may be used generally to refer to data strobe (DQS) signals, upper data strobe signals (UDQS), or lower data strobe signals (LDQS).

An impedance (ZQ) calibration signal may also be provided to the memory device 10 through the I/O interface 16. The ZQ calibration signal may be provided to a reference pin and used to tune output drivers and die termination (ODT) values by adjusting pull-up and pull-down resistors of the memory device 10 across changes in process, voltage, and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor may act as a reference for adjusting internal ODT and drive strength of the I/O pins.

In addition, a loopback signal (LOOPBACK) may be provided to the memory device 10 through the I/O interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both data and a strobe or possibly just a data pin. This is generally intended to be used to monitor the data captured by the memory device 10 at the I/O interface 16.

As will be appreciated, various other components such as power supply circuits (for receiving external positive supply voltage (VDD) and negative supply voltage (VSS) signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
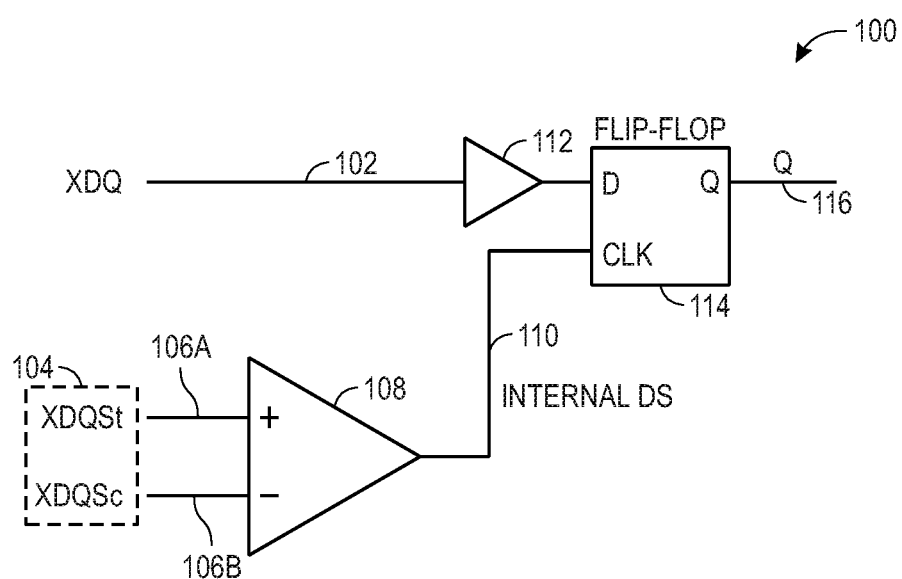
FIG. 2 is a block diagram illustrating schematic circuitry that may be used in the memory device of FIG. 1 to capture input data using a clocking signal, in accordance with an embodiment.

As discussed above and detailed below, circuitry in the I/O interface 16 may receive data and strobe signals to store the data to perform a write command. FIG. 2 illustrates a diagram of a circuit 100 that receives an external data signal (XDQ) 102 (e.g., DQ, UDQ, LDQ of FIG. 1) and an external data strobe clock signal (XDQS) 104 (e.g., UDQS and LDQS of FIG. 1) at a flip-flop 114. Although the following discussion describes a flip-flop 114 receiving the data signal (XDQ) 102 and the data strobe clock signal (XDQS) 104, which represents a particular embodiment, the systems and methods described herein may instead use a latch (e.g., transparent D-latch) that is level triggered (e.g., falling edge triggered). Moreover, although the following discussions describe processing the data strobe clock signal (XDQS) 104 to generate an internal data strobe clock signal (DS) 110, which represents a particular embodiment, the systems and methods described herein may additionally or alternatively use any data clock signal and any data signal for the inputs into the latch.

In some embodiments, the data strobe clock signal (XDQS) 104 may be received as a differential pair of signals XDQS_t 106A and XDQS_c 106B by the external device. Comparator circuitry 108 (e.g., a differential amplifier) may be used to generate a digital internal strobe clock signal (DS) 110. Circuit 100 may also include a delay buffer 112, which may delay the incoming external data signal (XDQ) 102. A flip-flop 114 may be used to store data from the external data signal (XDQ) 102 using the internal data strobe clock signal (DS) 110. As previously mentioned, although the depicted embodiment describes the flip-flop 114 receiving the data signal and corresponding clock signal, which represents a particular embodiment, the systems described herein may be used with the latch that is level triggered. That is, the data signal (XDQ) 102 and the data strobe clock signal (XDQS) 104 and/or the internal data strobe clock signal (DS) 110 may be used to latch data from the data line when the clock input is high. If the data on the data line from the data signal (XDQ) 102 changes states while the internal data strobe clock signal (DS) 110 is at a logic high (e.g., 1), then the output (Q) 116 may follow the input data from the data signal (XDQ) 102. However, when the internal data strobe clock signal (DS) 110 is at a logic low (e.g., 0), then the last state of the input (D) from the data signal (XDQ) 102 is trapped and held in the latch.

Delay buffer 112 may be used to provide a delay to the incoming data signal (XDQ) 102 to match latencies in the data strobe clock signal (XDQS) 104 path through a differential amplifier 108. After latching data as the output (Q) 116, the data may be available to the data path 46, as discussed above. It should be appreciated that in a circuit having the architecture described in FIG. 1, I/O interface 16 may receive two data strobe clock signals (XDQS) 104 (e.g., the lower data signal (LDQS) and the upper data signal (UDQS)) that may be treated by two differential amplifiers to produce two internal data strobe clock signals (DS) 110. In this architecture, each strobe signal may drive 8 flip-flops to latch 8 bits of data. The latched data may be provided to data path 46 to perform the write command.

As discussed above, the clock signal, such as the data strobe clock signal (XDQS) 104 or the internal data strobe clock signal (DS) 110, may transition to a logic high state (e.g., logic 1) at the same time or approximately the same time as the data signal, such as the data signal (XDQ) 102. That is, the data signal (XDQ) 102 may also transition from a logic 0 to 1 or 1 to 0 when the internal data strobe clock signal (110) is high. As such, the flip-flop 114 or latch may capture an indeterminate value between 0 and 1. As a result, the output (Q) 116 may be in an uncertain state and may drive other memory elements or circuitry that uses this output (Q) 116 to an unknown state.

Figure 3:
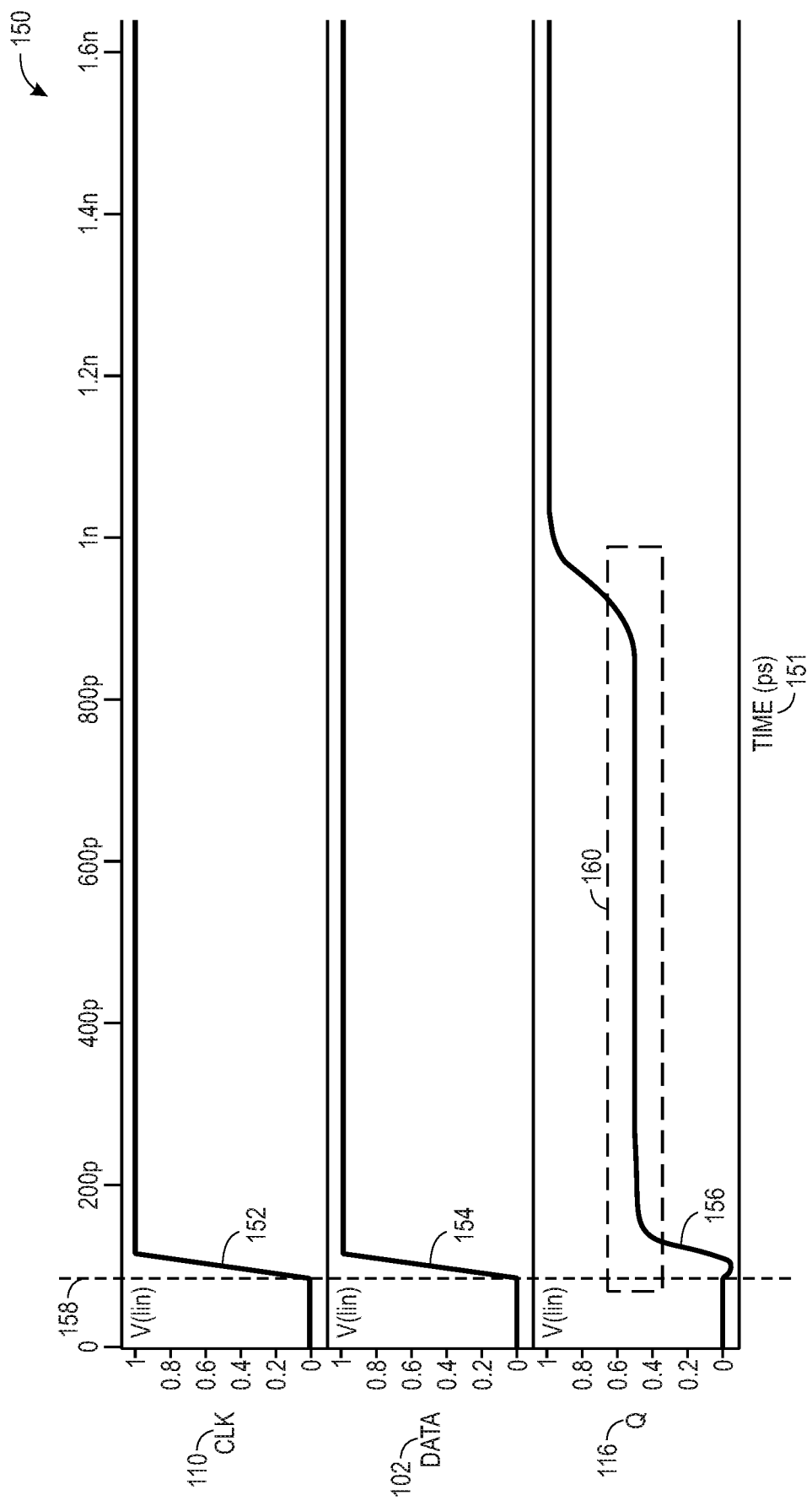
FIG. 3 is a timing diagram illustrating the effect of metastability in the capture of data illustrated in FIG. 2, in accordance with an embodiment.

To illustrate, FIG. 3 shows a timing relationship diagram 150 that results in a metastable output of a D-type latch. Although the following discussions describe a D-type latch, which represents a particular embodiment, the discussions described herein may apply to other latches, flip-flops, and/or registers, such as a D-type flip-flip or a cross-coupled Set-Reset (SR) latch. The timing relationship depicted is between a clock signal, such as the internal data strobe clock signal (DS) signal 110, and a data signal, such as the data signal (XDQ) 102, that may result in a metastable output over time 151. As shown, a clock signal curve 152 may correspond to the internal data strobe clock (DS) signal 110. A data curve 154 may correspond to the data signal (XDQ) 102, and an output curve 156 may correspond to the resulting output (Q) 116. The first edge in the data curve 154 may be measured relative to the rising edge of the clock signal curve 152 at an output time 158.

As shown, the data curve 154 depicting data signal (XDQ) 102 may not be in a logic state of either 1 or 0. Instead, the state may be an indeterminate value between 0 and 1. As indicated by the dashed line box, an indeterminate output 160 may be captured as the output (Q) 116. In some embodiments, the memory device 10 may receive the first rising edge of the internal data strobe clock signal (DS) 110 before or after the measured time 158, such as within an allowable range of timing skews that may be specified by a memory standard (e.g., DDR5 specification). This range of timing may also contribute to the data signal (XDQ) 102 not carrying a definite 1 or 0.

The indeterminate output 160 may reach a logic high (e.g., 1) after some time (approximately 1 nanosecond (ns)). Although the depicted embodiment illustrates the indeterminate output 160 reaching a logic high after 1 nanosecond of time 151, which represents a particular embodiment, the indeterminate output 160 may instead reach a logic low (e.g., 0) and/or a logic high (e.g., 1) after some other amount of time 151 (e.g., 600 ps, 1.2 ns, 1.4 ns, and so forth). In any case, the indeterminate state 160 may be captured for some time, such as the depicted time 151 period of approximately 40 picoseconds to approximately 1 nanosecond. The indeterminate output 160 may be sent as an unknown or uncertain value to be used in subsequent memory operations that may result in errors. Moreover, the indeterminate output 160 may result in a loss of data bits (e.g., 0 or 1) on the data line from the data signal (XDQ) 102 as a result of the indeterminate output 160. Since the output (Q) 116 may be an indeterminate value, the D-latch may be in a metastable state.

As previously mentioned, to resolve a metastable condition, a memory element's (e.g., latch or elements of the latch) internal feedback path may be amplified. Additionally or alternatively, capacitive load on the internal feedback path nodes may be reduced or eliminated. Furthermore, additionally or alternatively, extending time for the asynchronously racing inputs (e.g., data strobe clock signal (DS) 110 and data signal (XDQ) 102) until a point at which the output (Q) 116 to be captured results in either a definite 1 or 0. As previously discussed, many write operations and/or circuitry to perform these operations, such as a delay locked loop (DLL), may benefit from mitigating metastability using these techniques. A delay locked loop is a synchronizer that may align phase of an input clock signal (e.g., data strobe clock signal (DS) 110) to a phase of an output clock signal (e.g., Clk) to ensure proper data transfers. After phase alignment occurs, each delay may provide a stable clock signal that is phase shifted from the input clock. A synchronizer, such as a pipelined flip-flop, may use two or more clock cycles at a receiving domain and multiple (e.g., two or more) clock signal assertions to allow for a suitable amount of time for the input signal (e.g., internal data strobe clock signal (110)) to the final output (Q) 116. In general, domain crossing may refer to a clock crossing that is a traversal of a signal in a synchronous digital circuit from one clock domain to another. If a signal does not assert for a suitable time, such as to allow the internal data strobe clock signal (DS) 110 to reach a definite output (Q) 116, it may appear asynchronous on an incoming clock boundary for the output clock signal.

Unfortunately, multiple consecutive clock assertions are not always available for certain asynchronous races, which may be referred to as "single-shot" cases herein. In such instances, delay elements may be used to stagger a single-shot pulse between the flip-flops. However, delays often result in a mean time between failure (MTBF) value that is not within an expected threshold value (e.g., lower than expected MTBF value). The MTBF may indicate an expected time duration between two failures for a repairable system.

As previously mentioned, rather than extending time, metastability may also be mitigated by amplifying a memory element's feedback path and/or reducing the capacitive load on the internal feedback path nodes. Moreover, quantifying MTBF for synchronizers may be especially beneficial if an input and/or output clock signal rate increases. That is, quantifying the MTBF for the memory element may help determine reducing metastability using the techniques described herein.

Figure 4:
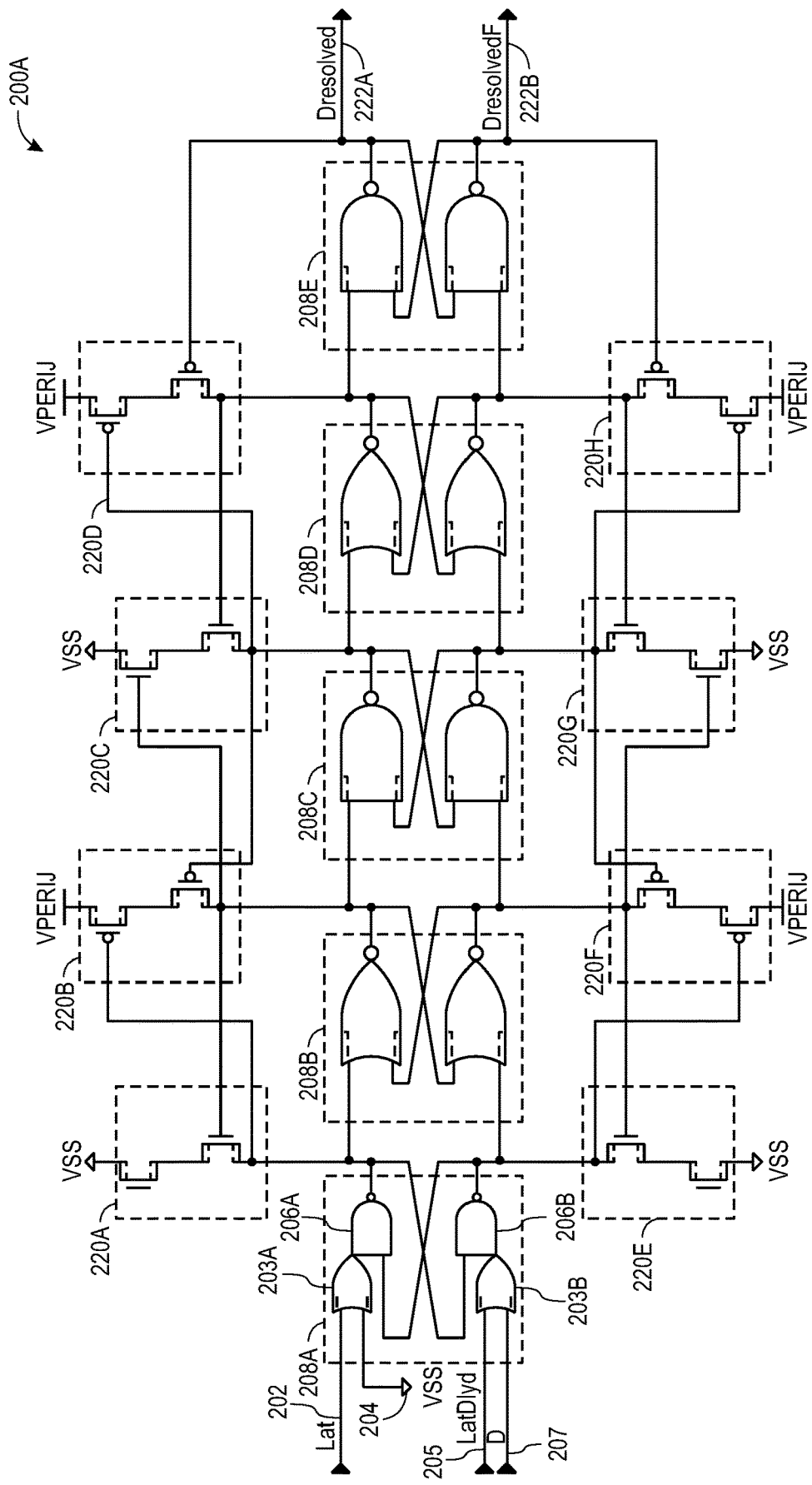
FIG. 4 is a block diagram illustrating schematic circuitry of a cascaded timing arbiter latch that maximizes amplification in the feedback path of the memory device to accurately capture data, in accordance with an embodiment.

To illustrate, FIG. 4 depicts a cascaded timing arbiter latch 200A that may prevent or reduce metastability by amplifying a latch feedback path. Although the depicted cascaded timing arbiter latch 200A includes five stages of timing arbiters 208 (e.g., 208A-E) of alternating NOT AND (NAND)-type and NOT OR (NOR)-type gates, which represents a particular embodiment, the systems and methods described herein may include one or more timing arbiters 208 (e.g., one, two, three, seven, and so forth) and/or other logic gate type timing arbiters 208 and/or a different sequence of logic gate type timing arbiters 208 (e.g., not in an alternating sequence).

In general, a timing arbiter 208 may be structurally similar to a cross-coupled SR NOR latch, but may operate differently. The timing arbiter 208 may include both inputs starting at a logic high (e.g., 1), which may be an invalid operation in an SR latch, and then either one of the inputs may transition to a logic low (e.g., 0). The timing arbiter 208 may hold an output state even if the other input signal subsequently transitions to low. That is, the timing arbiter 208 may arbitrate between the two input signals to determine which of the input signals transitioned to the logic low first. Specifically, since two signals may transition from a previous state, the timing arbiter 208 may use a positive feedback mechanism (e.g., an output from the transitioning signal gate may feed back as an input to the other gate and signal) to resolve gate output states. The timing arbiters 208 in the cascaded timing arbiter latch 200 may provide feedback amplification that is approximately the same gain as a feedforward path (e.g., from an output of a first NOR gate of the timing arbiter 208 as an input to a second NOR gate of the timing arbiter 208) of the cross-coupled feedforward path, allowing the timing arbiter 208 to resolve a race between its input signals in a shorter amount of time than may otherwise result in the latch (e.g., transparent D-latch).

By way of example, a first timing arbiter 208A may include two OR gates that feed their respective outputs into respective NAND gates. As shown, a latch clock signal (LAT) 202 (e.g., internal data strobe clock signal (DS) 110 of FIG. 2) and a voltage source supply 204 may be inputs into a first OR gate 203A, which may output a first input signal into a first NAND gate 206A. A latch delayed clock signal (LATDLYD) 205 (e.g., a delayed internal data strobe clock signal (DS) 110) and an input data signal (D) 207 (e.g., data signal (XDQ) 102 of FIG. 2) may be an input into a second OR gate 203B, which may output a second input signal into a second NAND gate 206B. The first input signal, the second input signal, and their respective outputs that feed back as inputs into the respective NAND gates 206A and 206B, may operate as previously discussed with respect to timing arbiters 208.

The input signals (e.g., latch clock signal (LAT) 202, and/or the input data signal (D) 207) may transition between logic high and logic low, and the cascaded timing arbiters 208 may amplify these signals. The amplification may make the difference between the signals large enough to identify the intended signal and resolve any metastability to provide an accurate output value for subsequent memory operations. That is, the input signals (e.g., latch clock signal (LAT) 202, and/or the input data signal (D) 207) and maximizing the latch's 200A internal feedback paths using the cascaded timing arbiters 208 may result in a definite state (e.g., 1 or 0) for a resolved output (DRESOLVED) 222A and a following resolved output (DRESOLVEDF) 222B. These resolved outputs 222A and 222B may connect to or may be sent to other memory circuitry to enable particular memory operations. Since the resolved outputs 222A and 222B are not indeterminate values 160, the subsequent memory operations may function as expected, such as without clocking errors that may result from indeterminate values 160. In some embodiments, rather than using both resolved outputs 222 in the subsequent memory operations, either the resolved output (DRESOLVED) 222A or the following resolved output (DRESOLVEDF) 222B may be used. By way of example, the resolved output (DRESOLVED) 222A may be used to drive a working load while the following resolved output (DRESOLVEDF) 222B remains unused. In such embodiments, the following resolved output (DRESOLVEDF) 222B may be connected to a dummy capacitive load that matches the working load connected to the resolved output (DRESOLVED) 222A.

Cascading the timing arbiters 208 provides differential gain from stage-to-stage, allowing for the multiple amplification stages. This may eliminate clocking at each stage as performed with other synchronizers, such as the pipelined flip-flop previously discussed. The number of timing arbiters 208 in the cascading timing arbiter latch 200A may correspond to an amount of gain or amplification. That is, the greater number of timing arbiters 208 may provide greater signal gain/amplification and reliability as an output value being a definite bit value of 1 or 0. However, multiple stages may result in propagation delay. Propagation delay may occur when an output transition is delayed, such that the delay propagates to subsequent circuitry that uses the output. That is, the subsequent circuitry may be consequently delayed since it waits for the output to completely transition to a valid value before using the output. The output may transition for a time period until the output may be determined or processed as either a 1 or 0 (e.g., valid value), rather than a value between 0 and 1 (e.g., metastable value). In this manner, a destination circuit using the output may avoid metastability in its operations.

In some embodiments, transistors 220 (e.g., transistor bridges) as indicated by the dashed dot line boxes, may be connected to respective logic gates (e.g., NAND gates, NOR gates) above and below the timing arbiters 208 to remove propagation delay. The transistors 220 (e.g., transistors 220A-H) may provide additional gain since the transistors may be controlled to provide more positive feedback from an output to an input within a timing arbiter 208 and/or between an output of a first timing arbiter 208 stage (e.g., the first timing arbiter 208A) to an input of another timing arbiter 208 stage (e.g., a second timing arbiter 208B). By way of example, this additional amplification from the output of the first timing arbiter 208A to an input of the second timing arbiter 208B may be especially beneficial when the input differences of the first timing arbiter 208A may be too small, such that the resulting output may transition in either direction (e.g., towards 1 or 0). Using the transistors 220, subsequent timing arbiter stages 208C-E may drive a signal perturbation back through the earlier stages (e.g., timing arbiters 208A and 208B) to resolve the metastable condition without significant output countermovement (e.g., no "shelve") on the resolved output 222A and/or following resolved output 222B. In particular, a race between the input signals (e.g., latch clock signal (LAT) 202, and/or the input data signal (D) 207) in a timing arbiter 208, such as the first timing arbiter 208A, may result in an oscillating output value (e.g., a value oscillating between 1 and 0) when resolving a voltage difference caused by the race. However, each of the subsequent timing arbiters 208 (e.g., the second timing arbiter 208B through a fifth timing arbiter 208E) may provide amplification in a unified direction towards the intended output value, such that the oscillation stabilizes towards the intended value with each amplification provided by the subsequent timing arbiters 208. In this manner, the oscillating output value may stabilize to a valid output of a 1 or 0.

The positive feedback from the transistors 220 may correspond to amplification, such that the greater amount of feedback provided by the transistors 220 (e.g., functioning as a switch to enable feedback paths) may result in greater amplification of the input signals (e.g., latch clock signal (LAT) 202, and/or the input data signal (D) 207). The amplification may provide a definite or determined resolved output 222A and/or following resolved output 222B of a 1 or 0. Stages of the timing arbiters 208 may generally resolve an output in different directions (e.g., one timing arbiter 208 resolving towards logic high (e.g., 1) and another timing arbiter 208 resolving towards a logic low (e.g., 0) state). However, stage-to-stage timing arbiters 208 with stage-to-stage positive feedback from the transistors 220 (e.g., stage-to-stage feedback devices) may allow the timing arbiters 208 to resolve the output in the same direction.

In addition to providing more amplification through additional positive feedback paths, the transistors 220 in the cascaded timing arbiter latch 200 may allow for abrupt state changes of the output with no practical metastable state. These stage-to-stage feedback devices may also bring previous timing arbiter 208 stages to rail faster during a setup time violation to prevent or mitigate a current shoot-thru (e.g., short circuit) that may otherwise occur while the outputs of the timing arbiters 208 and/or latch 200 are metastable. A shoot-thru may refer to a high current (e.g., 1 milliamp (mA) to 10 mA) flowing through the transistors 220 and distortion in a load voltage that may result from a short circuit across the voltage supply. The short circuit may occur when the one or more transistors 220 in a transistor bridge, such as two transistors 220 in a half bridge, are simultaneously switched to ON.

Figure 5:
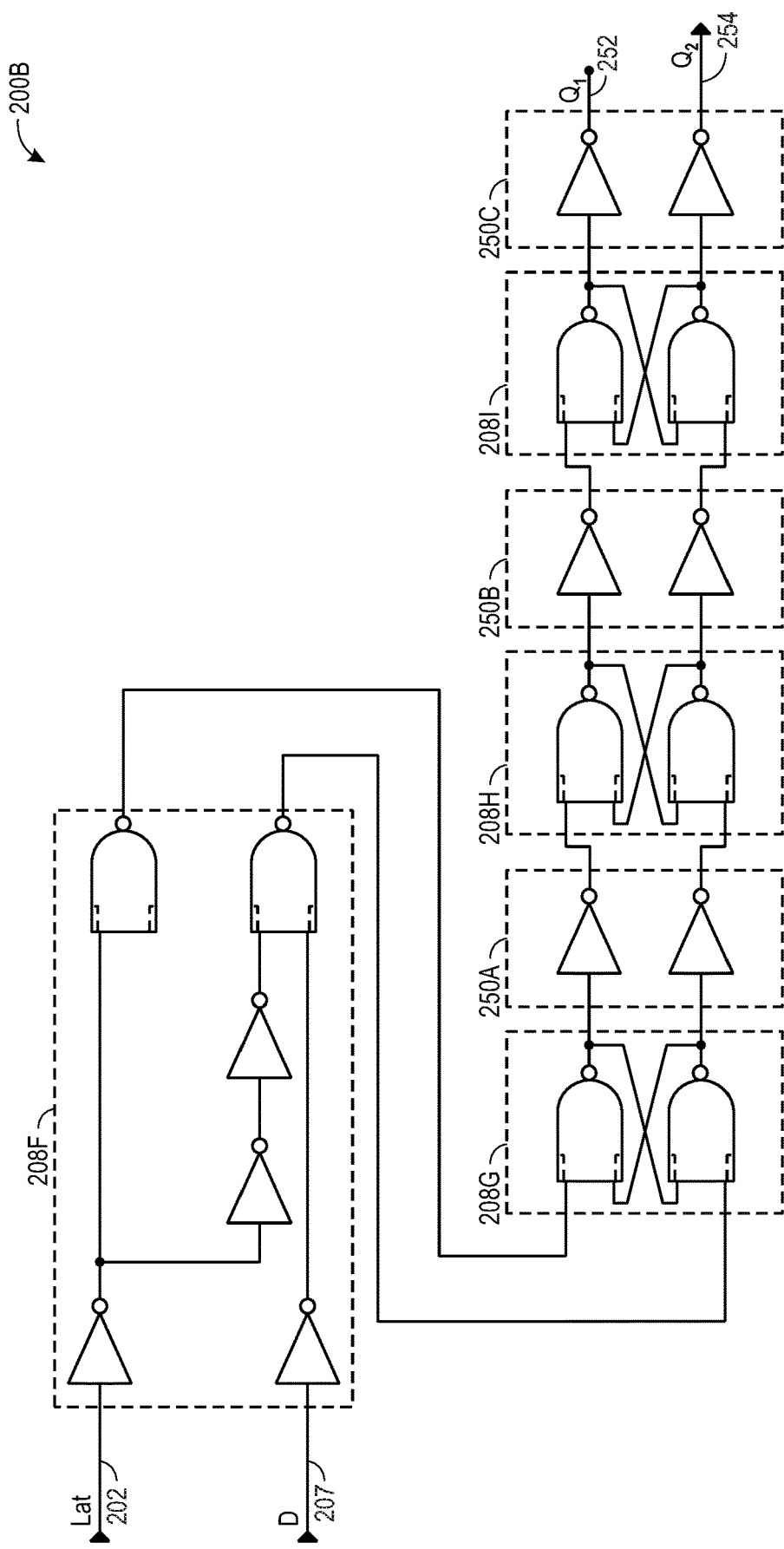
FIG. 5 is a block diagram illustrating schematic circuitry of another cascaded timing arbiter latch that minimizes capacitive loading on internal feedback path nodes to accurately capture the data, in accordance with an embodiment.

As previously mentioned, rather than extending time, metastability may be mitigated by amplifying a memory element's feedback path and/or reducing the capacitive load on the internal feedback path nodes. Although the cascaded timing arbiter latch 200 of FIG. 4 amplifies the latch's feedback path to mitigate metastability of the output, the cascaded timing arbiter latch 200A may result in capacitive loading on the feedback nodes. To reduce the capacitive loading, an alternative cascaded timing arbiter latch 200B architecture may be used. Specifically, the capacitive load on the internal feedback path (e.g., crossed-coupled feedback paths of the timing arbiters 208) of the latch 200A may be reduced or eliminated to resolve the metastable condition using the alternative cascaded timing arbiter latch 200B, as shown in FIG. 5.

As shown, the cascaded timing arbiter latch 200B may include four stages of timing arbiters 208 (e.g., 208F-208I) with NAND type logic gates, which represents a particular embodiment. Moreover, the timing arbiters 208 may alternate with a respective set of inverters 250 (e.g., inverters 250A-C), as indicated by the dashed dot line box. Furthermore, the cascaded timing arbiter latch 200B may not include stage-to-stage feedback devices, such as the transistors 220 of FIG. 4. It should be appreciated that the systems and methods described herein may instead include one or more timing arbiters 208 (e.g., one, two, three, and so forth) and/or other different logic gate type timing arbiters 208 and/or a different sequence of the logic gate type timing arbiters 208 (e.g., not an alternating sequence with the inverters 250).

In general, the cascaded timing arbiter latch 200B may minimize capacitive loading on the internal feedback path processing nodes to accurately capture data. Processing nodes may refer to a manufacturing technology standard used for the systems and methods described herein (e.g., the cascaded timing arbiter latch 200). In some embodiments, the processing node may refer to a minimum transistor width used in the technology (e.g., complementary metal-oxide-semiconductor (CMOS) transistor). Thus, a processing node of a particular width (e.g., a 45 nanometer (nm) processing node, a 2 micrometer (μm) processing node, etc.) may refer to a transistor 220 with a minimum width of the particular width. By way of example, the 2 μm processing node may include a transistor 220 with a minimum width of 2 μm. Such transistors 220 may include a high gate capacitance with a slow processing speed. Similarly, the 45 nm processing node may include a transistor 220 with a minimum width of 45 nm. Such transistors 220 may include relatively less capacitive loading and a faster processing speed. The input signals, such as the latch clock signal (LAT) 202, and/or the input data signal (D) 207, may transition between logic high and logic low. When the logic states change, the cascaded timing arbiters 208 alternating with the inverters 250 may minimize capacitive load on the internal feedback path nodes. Minimizing the capacitive load may prevent or reduce metastability that may otherwise occur when determining a first output ($Q_1$) 252 (e.g., output (Q) 116 of FIG. 2) and/or a second output ($Q_2$) 254. In some embodiments, the first output ($Q_1$) 252 may correspond to the resolved output 222A (DRESOLVED) and the second output ($Q_2$) 254 may correspond to the following resolved output (DRESOLVEDF). In this manner, both the cascaded timing arbiter latches 200A and 200B may prevent or mitigate metastability that may otherwise occur when determining an output (Q) 116. However, utilizing one over the other may depend on a process node of the feedback mechanism.

Figure 6:
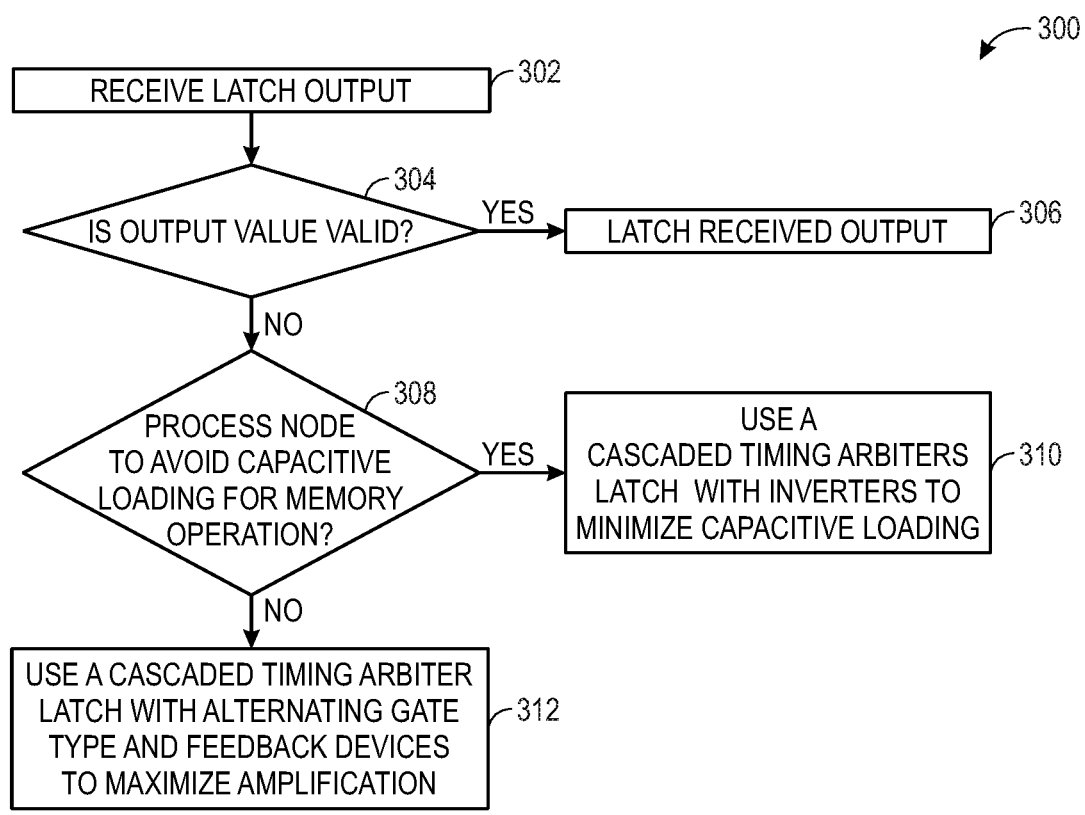
FIG. 6 is a flow chart of a method to mitigate metastability using the cascaded timing arbiter latches, in accordance with an embodiment.

To illustrate, FIG. 6 is a flowchart of a method for metastability mitigation 300 according to embodiments of the present disclosure. Any suitable device or circuitry that may control components of the memory device 10, such as the latch 200, may perform metastability mitigation 300. While the metastability mitigation is described using steps in a specific sequence, it should be understood that the present disclosure contemplates that the described steps may be performed in different sequences than the sequence illustrated, and certain described steps may be skipped or not performed altogether.

The process may include an input circuitry receiving (process block 302) a latch output (e.g., the output (Q) 116 of FIG. 2). As previously discussed, a clock signal (e.g., data strobe clock signal (XDQS) 104 or the internal data strobe clock signal (DS) 110 of FIG. 2) may transition from a first state (e.g., logic 1) to a second state (e.g., logic 0) at the same time as a data signal (e.g., data signal (XDQ) 102 of FIG. 2) sends data (e.g., 0 or 1 bit values) to be stored in the latch. That is, the data signal (XDQ) 102 may transition from a logic high or low to a logic low or high when the data strobe clock signal (DS) 110 is high. As such, the latch may capture an indeterminate output 160 between a 0 and a 1 as the output (Q) 116. Thus, the output (Q) 116 may be uncertain and may drive other memory elements or circuitry that uses this output (Q) 116 to an unknown state.

The metastability mitigation 300 may include the input circuitry determining (decision block 304) whether the output (Q) 116 is valid, such that it does not include the indeterminate output 160. If the output (Q) 116 is valid, then the input circuitry may capture or latch (process block 306) the received output (Q) 116. That is, since the output (Q) 116 is at least within an expected format (e.g., definite state of 1 or 0), the output (Q) 116 may be used in subsequent memory operations. On the other hand, if the output (Q) 116 is not valid, the input circuitry may determine (decision block 308) whether a processing node is to avoid capacitive loading on the internal feedback path for the particular memory operation being performed or to be performed. That is, some operations may be significantly impacted from capacitive loading on the feedback path. As such, these operations may benefit from avoiding a system that may result in capacitive loading on the internal feedback even if the system results in definite or certain outputs (Q) 116 (e.g., not an indeterminate output 160). Thus, the input circuitry may use (process block 310) a cascaded timing arbiter latch 200B with inverters to minimize the capacitive loading, as discussed with respect to FIG. 5.

However, other memory operations may benefit from amplifying the input signals even considering the associated capacitive loading on the feedback path nodes when mitigating metastability. In such operations, the input circuitry may use (process block 312) a cascaded timing arbiter latch 200A with alternating gate types (e.g., a first timing arbiter 208A with NAND type gates, a second timing arbiter 208B with NOR type gates, a third timing arbiter 208C with NAND type gates, and so forth) to maximize amplification, as discussed with respect to FIG. 4. In some instances, the input circuitry may also use feedback devices, such as transistors 220, for additional gain between stages of the cascaded timing arbiters 208.

While the embodiments described herein may be susceptible to various modifications and alternative forms, specific embodiments have been shown by way of example in the drawings and have been described in detail herein. However, it should be understood that the disclosure is not intended to be limited to the particular forms disclosed. Rather, the disclosure is to cover all modifications, equivalents, and alternatives falling within the spirit and scope of the techniques and system described in the disclosure as defined by the following appended claims.

What is claimed is:

1. A memory device, comprising:
   a latch configured to receive a data signal and a data strobe clock signal to latch an output data signal, wherein the data signal changes logic states while the data strobe clock signal is in a logic high state to enable latching data from the data signal, wherein the latch comprises:
   a plurality of NAND-type timing arbiters comprising a plurality of cross-coupled NAND gates; and
   a plurality of NOR-type timing arbiters comprising a plurality of cross-coupled NOR gates, wherein the plurality of NAND-type timing arbiters and the plurality of NOR-type timing arbiters alternate, and wherein the plurality of NAND-type timing arbiters and the plurality of NOR-type timing arbiters are configured to receive the data signal and the data strobe clock signal to provide the output data signal.

2. The memory device of claim 1, the latch comprising:
   a plurality of transistors configured to enable a feedback path from an output of a first NAND gate of the plurality of cross-coupled NAND gates to an input of a second NAND gate of the plurality of cross-coupled NAND gates.

3. The memory device of claim 2, wherein the plurality of transistors are coupled to the plurality of NAND-type timing arbiters, the plurality of NOR-type timing arbiters, or a combination thereof.

4. The memory device of claim 1, the latch comprising:
   a plurality of transistors configured to enable a feedback path from an output of a first NOR gate of the plurality of cross-coupled NOR gates to an input of a second NOR gate of the plurality of cross-coupled NOR gates.

5. The memory device of claim 1, wherein the plurality of NAND-type timing arbiters and the plurality of NOR-type timing arbiters are disposed in a cascaded structure.

6. The memory device of claim 1, wherein the output data signal is a logic 1 or a logic 0.

7. The memory device of claim 1, wherein the alternating plurality of NOR-type timing arbiters and the plurality of NAND-type timing arbiters are arranged to amplify gain of the data signal, the data strobe clock signal, or a combination thereof, using a feedback mechanism of the respective plurality of cross-coupled NOR gates and the respective plurality of cross-coupled NAND gates.

8. The memory device of claim 7, wherein the amplification of the data signal, the data strobe clock signal, or a combination thereof, reduces metastability of the output data signal.

9. A method to prevent metastability in an input/output (IO) circuitry of a memory device comprising a latch, comprising:
   receiving a latched output signal;
   determining whether the latched output signal is a logic 0 or a logic 1;
   in response to determining that the latched output signal is not a logic 0 or a logic 1, determining whether a memory operation associated with the latch is to avoid capacitive loading on an internal feedback path of the latch; and
   in response to determining that the memory operation is to avoid the capacitive loading, using a cascaded timing arbiter latch with at least one timing arbiter and at least one inverter to minimize the capacitive loading.

10. The method of claim 9, wherein the cascaded timing arbiter latch comprises a plurality of NAND-type timing arbiters, wherein the plurality of NAND-type timing arbiters are disposed in a cascaded structure and alternating with a plurality of inverters.

11. The method of claim 9, wherein the memory operation comprises a write leveling (WL) operation.

12. The method of claim 9, wherein the latched output signal comprises an indeterminate output value, wherein the indeterminate output value comprises a value between a logic 0 and a logic 1.

13. The method of claim 9, wherein the method comprises:
   in response to determining that the memory operation is not to avoid capacitive loading, using a cascaded timing arbiter latch with a plurality of NAND-type timing arbiters and a plurality of NOR-type timing arbiters, wherein the plurality of NAND-type timing arbiters and the plurality of NOR-type timing arbiters alternate in a cascaded architecture.

14. The method of claim 13, wherein the cascaded timing arbiter latch comprises five stages of timing arbiters.

15. The method of claim 14, wherein each of the five stages of timing arbiters corresponds to an amount of signal amplification of input signals.

16. The method of claim 14, wherein the cascaded timing arbiter latch comprises a plurality of transistor bridges connected above and below each of the stages of timing arbiters.

17. The method of claim 16, wherein the plurality of transistor bridges enable feedback paths to provide additional amplification to input signals that input into the latch.

18. A memory device, comprising:
   a latch configured to receive a data signal and a data strobe clock signal to latch an output data signal, wherein the latch comprises:
   a plurality of NAND-type timing arbiters comprising a plurality of cross-coupled NAND gates; and
   plurality of inverters, wherein the plurality of NAND-type timing arbiters and the plurality of inverters alternate and are disposed in a cascaded architecture, wherein the plurality of NAND-type timing arbiters and the plurality of inverters are configured to receive the data signal and the data strobe clock signal to provide the output data signal.

19. The memory device of claim 18, wherein the latch aligns a phase of an input domain clock associated with the data strobe clock signal to an output domain clock associated with a different clock signal.

20. The memory device of claim 18, wherein the latch comprises a falling edge triggered D-type latch.

* * * * *